United States Patent
Mochida

(10) Patent No.: US 11,632,085 B2
(45) Date of Patent: *Apr. 18, 2023

(54) DISTORTION COMPENSATION DEVICE AND DISTORTION COMPENSATION METHOD

(71) Applicant: SUMITOMO ELECTRIC INDUSTRIES, LTD., Osaka (JP)

(72) Inventor: Eiji Mochida, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 172 days.

This patent is subject to a terminal disclaimer.

(21) Appl. No.: 17/158,267

(22) Filed: Jan. 26, 2021

(65) Prior Publication Data

US 2021/0152133 A1 May 20, 2021

Related U.S. Application Data

(63) Continuation of application No. 16/483,777, filed as application No. PCT/JP2017/040289 on Nov. 8, 2017, now Pat. No. 11,005,430.

(30) Foreign Application Priority Data

Mar. 2, 2017 (JP) .................. 2017-039172

(51) Int. Cl.
 *H03F 1/32* (2006.01)
 *H03F 3/24* (2006.01)
(52) U.S. Cl.
 CPC ........... *H03F 1/3258* (2013.01); *H03F 3/245* (2013.01); *H03F 2200/451* (2013.01)

(58) Field of Classification Search
 CPC ........................................................ H03F 1/32
 USPC .......................................... 330/149; 375/297
 See application file for complete search history.

(56) References Cited

U.S. PATENT DOCUMENTS

| | | |
|---|---|---|
| 9,225,364 B1 | 12/2015 | Usui et al. |
| 9,374,044 B2 | 6/2016 | Jian et al. |
| 9,876,472 B2 | 1/2018 | Lee et al. |
| 11,005,430 B2 * | 5/2021 | Mochida ............... H03F 3/19 |
| 2007/0164818 A1 | 7/2007 | Horiguchi et al. |
| 2012/0002752 A1 | 1/2012 | Coan et al. |
| 2014/0294120 A1 | 10/2014 | Gandhi et al. |
| 2015/0349725 A1 | 12/2015 | Hirai et al. |
| 2019/0393842 A1 * | 12/2019 | Mochida ............... H03F 3/19 |

(Continued)

FOREIGN PATENT DOCUMENTS

| | | |
|---|---|---|
| EP | 1 104 093 A1 | 5/2001 |
| JP | 2002-135349 A | 5/2002 |

(Continued)

OTHER PUBLICATIONS

Notice of Allowance dated Jan. 14, 2021 in U.S. Appl. No. 16/483,777.

*Primary Examiner* — Henry Choe
(74) *Attorney, Agent, or Firm* — Faegre Drinker Biddle & Reath LLP

(57) ABSTRACT

A distortion compensation device includes: a first predistorter configured to compensate for a distortion in an amplifier; and a second predistorter configured to compensate for the distortion in the amplifier, and update distortion compensation characteristics at a higher frequency than that of the first predistorter.

12 Claims, 5 Drawing Sheets

(56) References Cited

U.S. PATENT DOCUMENTS

2021/0152133 A1* 5/2021 Mochida ............... H03F 1/3258
2021/0328553 A1* 10/2021 Mochida .................. H03F 1/32

FOREIGN PATENT DOCUMENTS

| JP | 2003-516013 A | 5/2003 |
| JP | 2005-244723 A | 9/2005 |
| JP | 2008-258714 A | 10/2008 |
| JP | 2012-114688 A | 6/2012 |
| JP | 2012-199716 A | 10/2012 |
| JP | 2013-5353 A | 1/2013 |
| JP | 2014-127829 A | 7/2014 |
| JP | 2014-204148 A | 10/2014 |
| JP | 2016-167763 A | 9/2016 |
| WO | WO-01/39367 A1 | 5/2001 |
| WO | WO-2006/031156 A1 | 3/2006 |

* cited by examiner

DISTORTION COMPENSATION DEVICE AND DISTORTION COMPENSATION METHOD

This application is a continuation of U.S. patent application Ser. No. 16/483,777, filed Aug. 6, 2019, which is a 371 of International Application No. PCT/JP2017/040289, filed Nov. 8, 2017, which claims priority on Japanese Patent Application No. 2017-039172 filed on Mar. 2, 2017, the entire contents of which are incorporated herein by reference.

TECHNICAL FIELD

The present invention relates to distortion compensation for an amplifier.

BACKGROUND ART

Amplifiers have non-linear characteristics. Distortion compensation techniques are used for compensating for distortions in signals caused by the non-linear characteristics. An example of a distortion compensation technique is disclosed in Patent Literature 1.

CITATION LIST

Patent Literature

PATENT LITERATURE 1: Japanese Laid-Open Patent Publication No. 2014-204148

SUMMARY OF INVENTION

A distortion compensation device according to one embodiment of the present disclosure is provided with a second predistorter configured to update distortion compensation characteristics at a higher frequency than that of a first predistorter configured to compensate for a distortion in an amplifier.

DESCRIPTION OF EMBODIMENTS

Problems to be Solved by Disclosure

Figure 1:
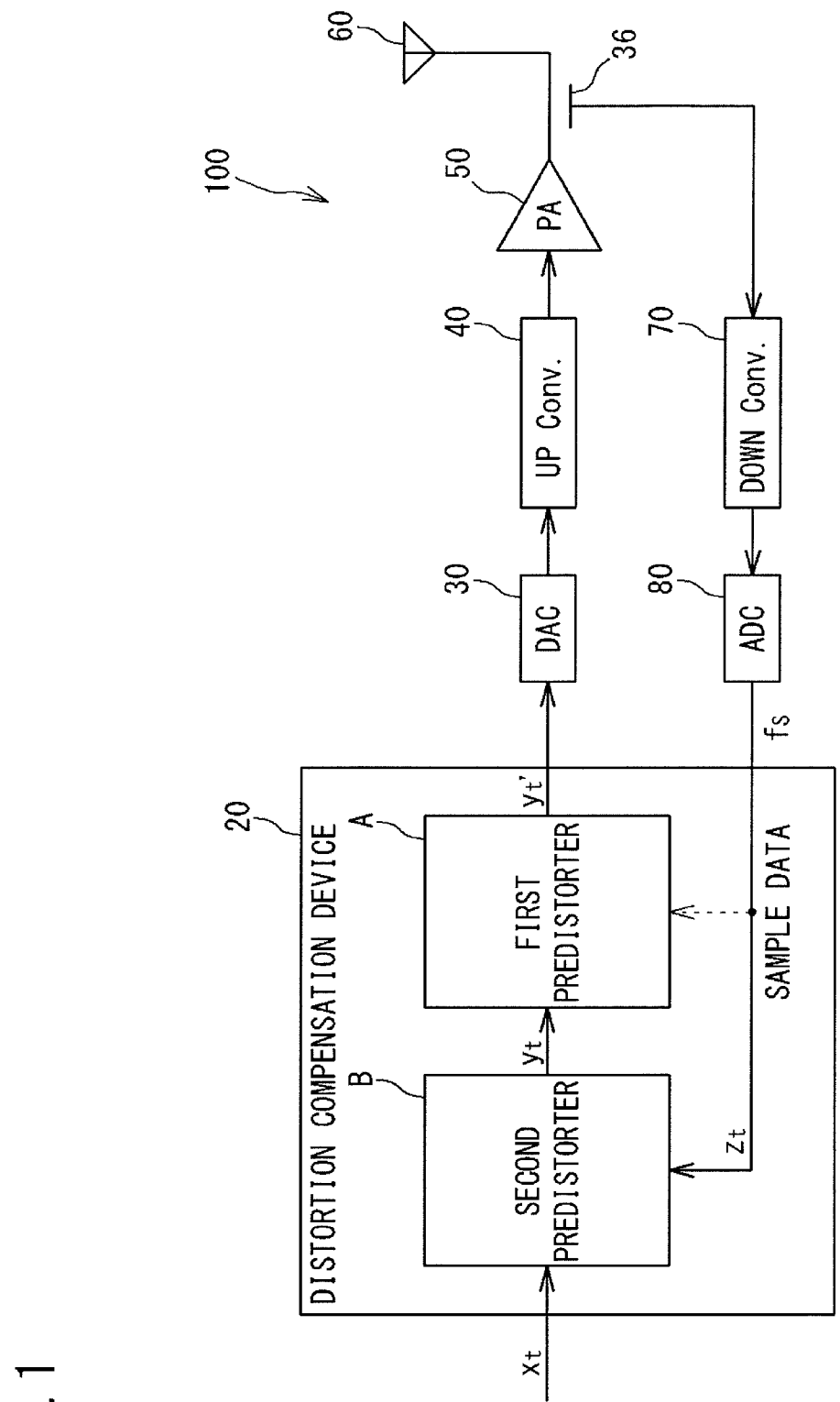
FIG. 1 is a block diagram showing a wireless communication apparatus including a distortion compensation device.

A distortion in an amplifier may instantaneously change, and such an instantaneous change in the distortion makes distortion compensation difficult.

An instantaneous change in distortion may occur in a GaN amplifier, for example. In the GaN amplifier, a transient response called an Idq drift is present. The Idq drift is a transient response in which a drain current becomes lower than a set value when the amplifier transitions from the high power state to the power-off state. In the GaN amplifier, due to the Idq drift, a distortion instantaneously changes in response to signal power fluctuation. In particular, signal power fluctuation is likely to occur in a communication system in which transmission and reception are alternately performed, such as time division duplex (TDD).

A change in distortion in an amplifier may sometimes be dealt with by updating distortion compensation coefficients, which are used in a distortion compensation device, in response to the change in the distortion, for example. By updating the distortion compensation coefficients, distortion compensation characteristics of the distortion compensation device are updated in response to the change in the distortion.

In order to follow an instantaneous change in distortion caused by an Idq drift or the like, it is considered to frequently perform update of the distortion compensation characteristics. However, since a processing load for updating the distortion compensation characteristics is great, it is not always easy to frequently perform update of the distortion compensation characteristics in preparation for a change in distortion. Therefore, a novel technique for dealing with a change in distortion is desired.

Advantageous Effects of Disclosure

According to the present disclosure, it is possible to deal with a change in distortion.

1. Outline of the Embodiment (1) A distortion compensation device according to an embodiment compensates for a distortion in an amplifier. The amplifier is a GaN amplifier, for example. The distortion in the amplifier is a distortion that is caused in an output signal by non-linear characteristics of the amplifier. The distortion compensation device can be provided with a first predistorter and a second predistorter. The distortion compensation device may be provided with three or more predistorters.

The first predistorter and the second predistorter each compensate for a distortion in the amplifier. The plurality of predistorters can compensate for the distortion in a shared manner. The second predistorter updates distortion compensation characteristics at a higher frequency than that of the first predistorter. The update of the distortion compensation characteristics is performed by, for example, updating a distortion compensation coefficient for distortion compensation. Updating the distortion compensation characteristics at a high frequency makes it easy to deal with a change in the distortion. The first predistorter may or may not update the distortion compensation characteristics.

(2) The second predistorter preferably compensates for a lower-order distortion as compared to the first predistorter. In this case, a processing load on the second predistorter can be reduced.

(3) The number of sample data to be used by the second predistorter for updating the distortion compensation characteristics is preferably less than the number of sample data to be used by the first predistorter. In this case, the second predistorter can easily update the distortion compensation characteristics at a high frequency.

(4) The first predistorter preferably includes a processor configured to execute a computer program for updating the distortion compensation characteristics. In this case, even when the distortion compensation is a complicated process, the first predistorter can easily execute the distortion compensation by software.

(5) The first predistorter may be an analog predistorter. In this case, the distortion compensation can be executed by an analog circuit.

(6) The second predistorter preferably includes a wired logic circuit for compensating for the distortion. In this case, the second predistorter can execute the distortion compensation at a high speed by the wired logic circuit.

(7) The first predistorter and the second predistorter are preferably cascade-connected to each other from the viewpoint of facilitating the design.

(8) The second predistorter is preferably connected to an input side of the first predistorter from the viewpoint of facilitating the design. However, the second predistorter may be connected to an output side of the first predistorter.

(9) The first predistorter and the second predistorter may be connected in parallel.

(10) A distortion compensation device according to an embodiment can be provided with: a first predistorter including a processor configured to execute a computer program for updating distortion compensation characteristics in an amplifier; and a wired logic circuit configured to update distortion compensation characteristics so as to deal with a change in the distortion that cannot be compensated for by the first predistorter, thereby compensating for the distortion that is not compensated for by the first predistorter. It is easy for the wired logic circuit to operate at a high speed. Therefore, when the wired logic circuit updates the distortion compensation characteristics so as to deal with a change in the distortion that cannot be compensated for by the first predistorter, the wired logic circuit can speedily compensate for the distortion that is not compensated for by the first predistorter. In addition, it is easy for the processor to perform a relatively complicated process. Therefore, when the first predistorter also performs distortion compensation, an increase in the scale of the wired logic circuit is inhibited.

(11) A distortion compensation device according to an embodiment can be provided with: an analog predistorter configured to compensate for a distortion in an amplifier; and a digital predistorter configured to update distortion compensation characteristics so as to deal with a change in the distortion that cannot be compensated for by the analog predistorter, thereby compensating for the distortion that is not compensated for by the analog predistorter. It is easy for the digital predistorter to update the distortion compensation characteristics, as compared to the analog predistorter. In addition, since the analog predistorter also performs distortion compensation, an increase in the processing load of the digital predistorter can be inhibited. The digital predistorter may include a processor for executing a computer program, or may include a wired logic circuit.

(12) A distortion compensation method according to an embodiment includes: compensating for a distortion in an amplifier by using a first predistorter and a second predistorter; and updating distortion compensation characteristics of the second predistorter at a higher frequency than that of the first predistorter.

(13) A distortion compensation method according to an embodiment includes: executing first predistortion and second predistortion to compensate for a distortion in an amplifier; and updating distortion compensation characteristics of the second predistortion so as to deal with a change in the distortion that cannot be compensated for by the first predistortion.

2. Details of Embodiments

[2.1 Distortion Compensation Device]

FIG. 1 shows a wireless communication apparatus 100 including a distortion compensation device 20. The wireless communication apparatus 100 is a base station or a mobile station for mobile communication, for example. The distortion compensation device 20 subjects a baseband signal $x_t$ outputted from a baseband processing unit (not shown) to predistortion, and outputs a distortion compensation signal $y_t'$. The distortion compensation signal $y_t'$ is converted to an analog signal by a digital-analog converter (DAC) 30 and converted to a radio frequency signal by an up-converter 40. The signal outputted from the up-converter 40 is amplified by a power amplifier (PA) 50. The signal outputted from the amplifier 50 is transmitted through an antenna 60.

The power amplifier 50 is a GaN amplifier, for example. In the GaN amplifier, an Idq drift causes an instantaneous change in distortion in the amplifier 50.

The communication apparatus 100 includes a coupler 36 for monitoring an output from the amplifier 50. The coupler 36 outputs a monitor signal $z_t$. The monitor signal $z_t$ is down-converted by adown-converter 70 and converted to a digital signal by an analog-digital converter (ADC) 80. It is assumed that the ADC 80 has a sampling frequency fs. The monitor signal $z_t$ is sampled at the sampling frequency fs to be discrete sample data.

The sample data $z_t$ is provided to the distortion compensation device 20. The distortion compensation device 20 updates distortion compensation characteristics on the basis of the sample data $z_t$.

The distortion compensation device 20 shown in FIG. 1 includes a plurality of predistorters A and B. The plurality of predistorters each execute predistortion. In FIG. 1, the predistorter A and the predistorter B are cascade-connected to each other. While the distortion compensation device 20 includes two predistorters A and B in FIG. 1, the distortion compensation device 20 may include three or more predistorters.

The predistorter A (first predistorter) serves to perform compensation for a distortion, of distortions in an amplifier, which does not temporally change or whose temporal change is gentle. A distortion whose temporal change is gentle is, for example, a changed portion of a distortion due to temperature change.

Regarding distortion compensation, the predistorter B (second predistorter) complements the predistorter A. That is, the predistorter B serves to compensate for a distortion component that cannot be compensated for by the predistorter A. The predistorter B according to the embodiment compensates for a distortion whose temporal change is quicker than that of a distortion to be compensated for by the predistorter A. A distortion whose temporal change is quick is, for example, a distortion that instantaneously changes due to an Idq drift.

In order to compensate for a distortion that does not temporally change or whose temporal change is gentle, the predistorter A does not update the distortion compensation characteristics or updates the distortion compensation characteristics at a low frequency. On the other hand, in order to deal with a distortion whose temporal change is quick, the predistorter B updates the distortion compensation characteristics at a high frequency.

Figure 2:
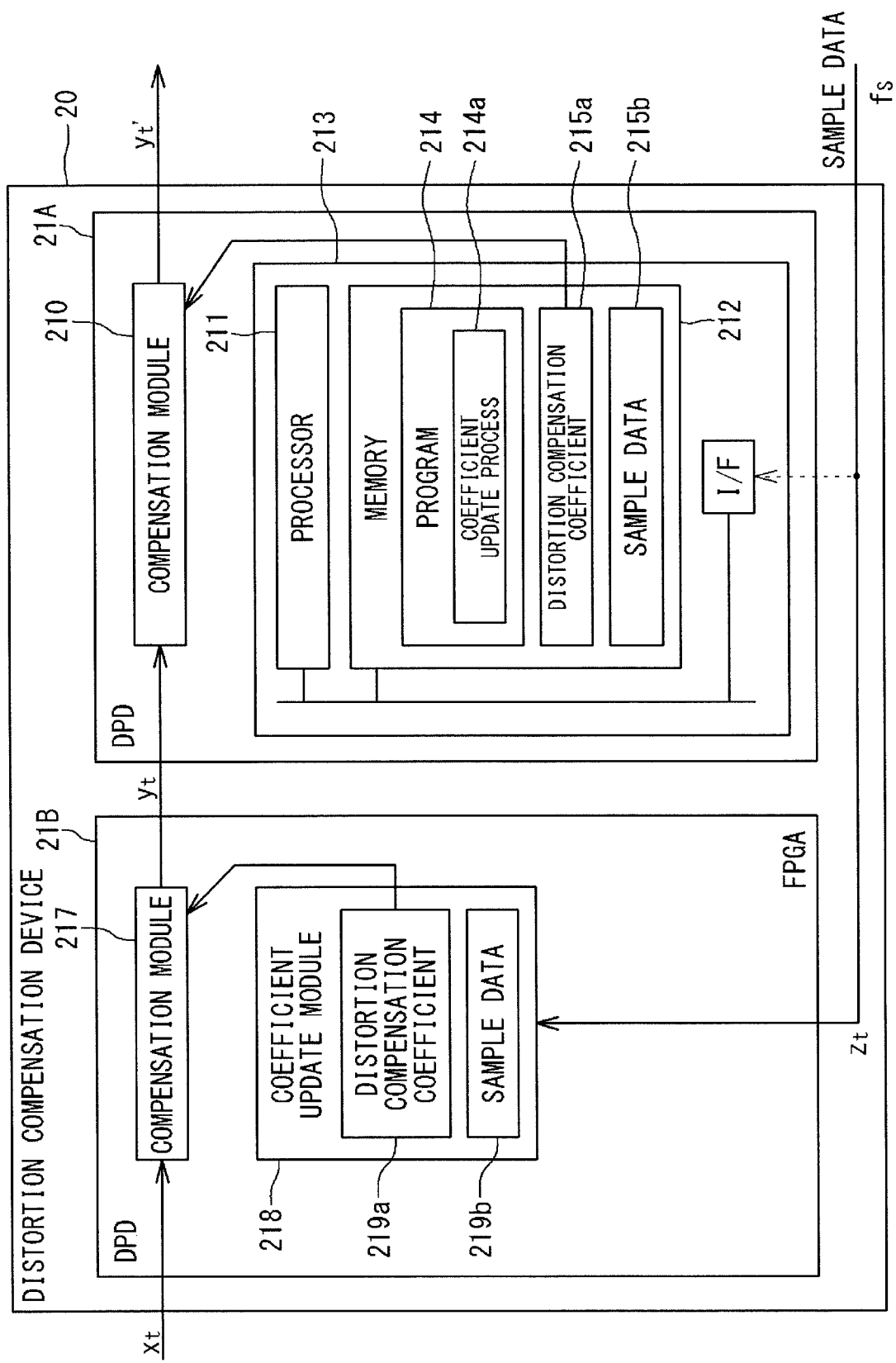
FIG. 2 is a block diagram showing the distortion compensation device.

FIG. 2 shows an example of the predistorter A and an example of the predistorter B. In FIG. 2, a predistorter 21A is an example of the predistorter A shown in FIG. 1. In FIG. 2, a predistorter 21B is an example of the predistorter B shown in FIG. 1.

The predistorter 21A is configured to execute digital predistortion (DPD). The predistorter 21A includes a compensation module 210. The compensation module 210 performs predistortion on a baseband signal (a signal $y_t$ outputted from the predistorter 21B). The compensation module 210 is implemented as a wired logic circuit such as a field-programmable gate array (FPGA), for example. Distortion compensation is performed based on a distortion compensation coefficient 215a. The distortion compensation coefficient 215a is a parameter that determines distortion compensation characteristics of the predistorter 21A. The wired logic circuit may be a reconfigurable logic circuit such as a FPGA, or may be a non-reconfigurable logic circuit.

Distortion compensation by the predistorter 21A compensates for relatively-high-order distortions (high-order nonlinearities) up to a 5-order or 7-order distortion, for example. Since the distortions up to the high-order distortion are compensated for, highly-accurate distortion compensation is realized. However, the number of distortion compensation coefficients 215a is increased.

The predistorter 21A includes a coefficient update module 213 that updates the distortion compensation coefficient 215a. In this embodiment, the coefficient update module 213 is implemented as a computer including a processor 211 and a memory 212. The processor 211 executes a computer program 214 stored in the memory 212.

The computer program 214 contains a program code that allows the processor 211 to execute a coefficient update process 214a for updating the distortion compensation coefficient 215a. The coefficient update process 214a is performed based on, for example, sample data 215b indicating the output $z_t$ from the amplifier 50. The sample data 215b obtained by the predistorter 21A is stored in the memory 212.

In the coefficient update process 214a, for example, the processor 211 solves a normal equation based on a least-squares method, on the basis of several thousands of sample data 215b that have been obtained through sampling within a predetermined time (e.g., a few minutes), thereby calculating the distortion compensation coefficient 215a. The calculated distortion compensation coefficient 215a is provided to the distortion compensation module 210 to update the distortion compensation coefficient used in the compensation module 210.

A calculation method such as the least-squares method is able to calculate a coefficient with high accuracy, but has a great processing load and takes long processing time. Moreover, the number of coefficients to be calculated is great, which further increases the processing load. In addition, when using a calculation method such as the least-squares method which needs a large quantity of sample data 215b for coefficient updating, time to obtain the large quantity of sample data 215b is needed.

However, the above-described matters do not pose problems in the predistorter 21A. Since the coefficient update process 214a is executed by the processor 211 at a low frequency such as once every a few minutes, a sufficient temporal margin for coefficient updating is ensured, and therefore, taking time for the process does not pose problems. Moreover, since a change in distortion due to a temperature change occurs gently, even the coefficient updating performed at a low frequency can follow the gentle change in distortion. However, the predistorter 21A cannot follow an instantaneous change in distortion caused by an Idq drift or the like. The instantaneous change in distortion is dealt with by the predistorter 21B.

The predistorter 21A may not have the coefficient update module 213. In this case, the predistorter 21A need not obtain the sample data 215b. When the predistorter 21A does not have the coefficient update module 213, a temporal change in distortion is dealt with by the predistorter 21B.

As described above, the predistorter 21B deals with a change in distortion that cannot be dealt with by the predistorter 21A, in particular, an instantaneous change in distortion. The predistorter 21B shown in FIG. 2 is configured to execute digital predistortion (DPD). In FIG. 2, the predistorter 21B is connected to an input side of the predistorter A (connected between the predistorter A and the baseband processing unit). The predistorter 21B is implemented as a wired logic circuit such as a field-programmable gate array (FPGA), for example. The wired logic circuit may be a reconfigurable logic circuit such as a FPGA, or may be a non-reconfigurable logic circuit.

The predistorter 21B includes a circuit that functions as a compensation module 217. The compensation module 217 includes a wired logic circuit for performing predistortion on a baseband signal (the signal $x_t$ outputted from the baseband processing unit). Distortion compensation is performed based on a distortion compensation coefficient 219a stored in a coefficient storage unit in the predistorter 21B. The distortion compensation coefficient 219a is a parameter that determines distortion compensation characteristics of the predistorter 21B.

Distortion compensation by the predistorter 21B compensates for a relatively-low-order distortion (low-order nonlinearity) such as a 3-order distortion. Since the low-order distortion is compensated for, less distortion compensation coefficients 219a are needed. Consequently, the processing load in the predistorter 21 is small. Therefore, an increase in the circuit scale of the predistorter 21B is inhibited.

When viewed from the predistorter 21B, only a distortion component, of the distortion in the amplifier 50, which has not been compensated for by the predistorter 21A is present, the nonlinearity of the distortion to be compensated for by the predistorter 21B is not particularly strong. Therefore, even when the predistorter 21B can compensate for only low-order distortions, it does not cause serious problems.

The predistorter 21B includes a circuit that functions as a coefficient update module 218 for updating the distortion compensation coefficient 219a. The coefficient update module 218 includes a wired logic circuit for updating the distortion compensation coefficient 219a. The coefficient updating is performed based on, for example, sample data 219b indicating an output $z_t$ from the amplifier 50. The sample data 219b obtained by the predistorter 21B is stored in a sample data storage unit in the coefficient update module 218.

The coefficient update module 218 performs calculation for updating the distortion compensation coefficient 219a at a higher frequency than that of the predistorter A. The coefficient update module 218, for example, updates the distortion compensation coefficient 219a for each sampling period 1/fs [s] of the sample data 219b, or updates the distortion compensation coefficient 219a for each period a few times as long as the sampling period 1/fs [s]. The coefficient update module 218, for example, calculates a distortion compensation coefficient 219a by least mean square (LMS) on the basis of one or a plurality of sample data 219b. The calculated distortion compensation coefficient 219a is provided to the compensation module 217 to update the distortion compensation coefficient used in the compensation module 217.

The number of sample data 219b used by the coefficient update module 218 for one-time coefficient updating is small. Therefore, some flip-flops provided in the coefficient update module 218 are enough as a coefficient storage unit for storing the sample data 219b therein. The coefficient storage unit need not be a large-capacity memory.

The distortion compensation coefficient based on the LMS is calculated on the basis of the following formulae (1) and (2), for example. The distortion compensation using the calculated distortion compensation coefficient is performed on the basis of formula (3).

[Math. 1]

$$\tilde{h}_t = h_{t-1} - \alpha \cdot K^H(z_{t-1}) \cdot (K(z_{t-1}) \cdot h_{t-1} - y_{t-1}) \quad (1)$$

[Math. 2]

$$h_t = \lambda \cdot h_{t-1} + (1-\lambda) \cdot \tilde{h}_t \quad (2)$$

[Math. 3]

$$y_t = K(x_t) \cdot h_t \quad (3)$$

In the above formulae, t is a discrete time, α is a predetermined coefficient, K is a polynomial vector for distortion compensation, $z_{t-1}$ is sample data at discrete time t−1, $h_t$ and $h_{t-1}$ are distortion compensation coefficients at discrete time t and discrete time t−1, respectively, $y_t$ and $y_{t-1}$ are outputs (distortion-compensated signals) from the predistorter 21B at discrete time t and discrete time t−1, respectively, and λ is a weight (0<λ<1).

Formula (1) calculates an updated value of the distortion compensation coefficient $h_{t-1}$ on the basis of the sample data $z_{t-1}$ and the output $y_{t-1}$ from the predistorter 21B. Formula (2) calculates a time average of the value updated by formula (1). The calculation of formula (3) is performed by using the time average, of the distortion compensation coefficient, calculated by formula (2). When the predistorter 21B obtains the sample data, if a delay d not less than one sampling period 1/fs [s] occurs, "t−1" in formulae (1) and (2) may be replaced with "t−d".

A calculation method such as the LMS is inferior in calculation accuracy to the least-squares method, but has less processing load than the least-squares method because the calculation is relatively simple. In addition, the number of coefficients to be calculated and the number of sample data 219b necessary for coefficient updating are less than those in the least-squares method.

The coefficient updating by the coefficient update module 218 is executed at a high frequency, for example, for each sampling period 1/fs [s] or for each period a few times as long as the sampling period 1/fs [s]. In addition, the coefficient update module 218 is a wired logic and therefore can perform calculation at a high speed. Consequently, the coefficient update module 218 can follow an instantaneous change in distortion caused by an Idq drift or the like to quickly update the distortion compensation coefficient 219a.

Although the coefficient update module 218 updates the coefficient at a high frequency, since the processing load per updating is not so great, the processing load can be reduced and the circuit scale is also reduced as compared to the case where a coefficient update process with a great processing load is performed at a high frequency.

According to the distortion compensation device 20 shown in FIG. 2, the predistorter 21A compensates for a distortion during a normal operation other than when an instantaneous change in distortion occurs due to an Idq drift or the like, and simultaneously, the predistorter 21B follows, in real time, the instantaneous change in distortion due to an Idq drift or the like to perform distortion compensation. Moreover, since the predistorter 21A is provided, an increase in the processing load of the predistorter 21B is inhibited, thereby inhibiting an increase in the hardware scale.

In the example shown in FIG. 2, the predistorter 21B is implemented as a wired logic circuit. However, regarding update of a distortion compensation coefficient, the predistorter 21B may be implemented as a computer having a processor and a memory, like the predistorter 21A. In this case, a coefficient update process in the predistorter 21B is performed when the processor executes a computer program stored in the memory.

[2.2 Another Example of Distortion Compensation Device]

Figure 3:
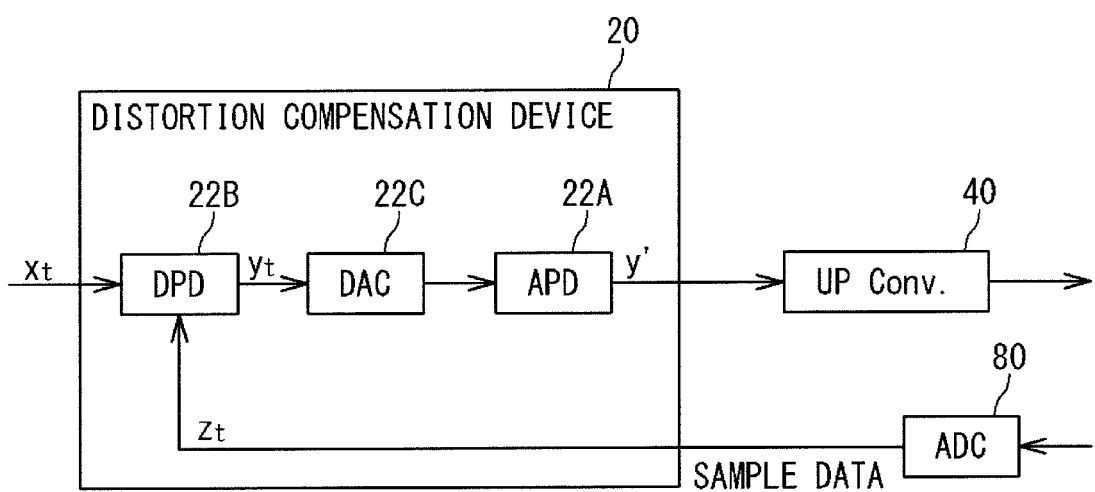
FIG. 3 is a block diagram showing a distortion compensation device.

FIG. 3 shows another example of the distortion compensation device 20. The distortion compensation device 20 shown in FIG. 3 includes a predistorter 22A and a predistorter 22B which are cascade-connected to each other. In FIG. 3, the predistorter 22A is an example of the predistorter A shown in FIG. 1. In FIG. 3, the predistorter 22B is an example of the predistorter B shown in FIG. 1.

The predistorter 22A shown in FIG. 3 performs analog predistortion (APD). The predistorter 22A is implemented as an analog circuit having inverse characteristics of amplification characteristics of the amplifier 50. The predistorter 22A shown in FIG. 3 is functionally equivalent to the predistorter 21A shown in FIG. 2 from which a coefficient update function is eliminated. The predistorter 22A shown in FIG. 3 does not have a function of updating distortion compensation characteristics, and therefore cannot deal with a temporal change in distortion. The predistorter 22B deals with a temporal change in distortion including an instantaneous change in distortion.

The predistorter 22B is configured to execute digital predistortion (DPD). The configuration and function of the predistorter 22B are the same as those of the predistorter 21B shown in FIG. 2. A coefficient update module in the predistorter 22B may be implemented as a computer having a memory and a processor.

According to the distortion compensation device 20 shown in FIG. 3, the predistorter 22A compensates for a distortion component, of the distortion in the amplifier 50, excluding a portion corresponding to a temporal change, and simultaneously, the predistorter 22B follows, in real time, the temporal change in distortion to perform distortion compensation. Moreover, since the predistorter 22A is provided, an increase in the processing load of the predistorter 22B is inhibited, thereby inhibiting an increase in the hardware scale.

In FIG. 3, a DAC 22C is provided between the predistorter 22B and the predistorter 22A. A digital distortion compensation signal outputted from the predistorter 22B is converted to an analog signal by the DAC 22C. An analog distortion compensation signal is provided to the predistorter 22A. Since an output from the predistorter 22A is an analog signal, a DAC 30 provided between the distortion compensation device 20 and the up-converter 40 in FIG. 1 is not necessary in FIG. 3.

Figure 4:
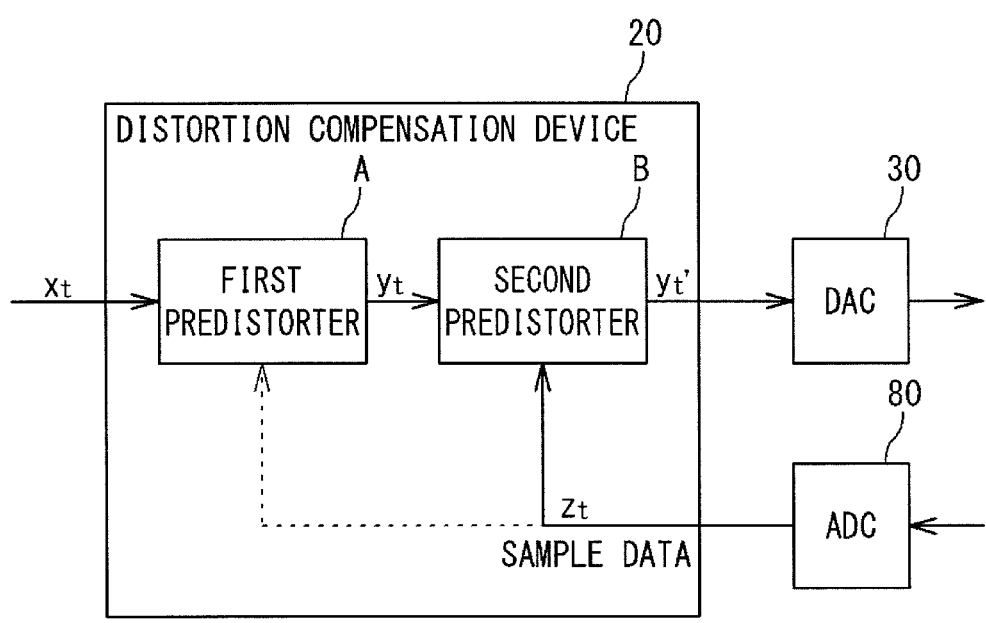
FIG. 4 is a block diagram showing a distortion compensation device.

FIG. 4 shows still another example of the distortion compensation device 20. The distortion compensation device 20 shown in FIG. 4 includes a predistorter A and a predistorter B which are cascade-connected to each other. In FIG. 4, the arrangement of the predistorter A and the predistorter B is inverted from that shown in FIG. 1, and the predistorter B is connected to the output side of the predistorter A.

Also in the distortion compensation device 20 shown in FIG. 4, the predistorter A compensates for a distortion during a normal operation other than when an instantaneous change in distortion occurs due to an Idq drift or the like, and simultaneously, the predistorter B follows, in real time, the instantaneous change in distortion due to an Idq drift or the like to perform distortion compensation. Moreover, since the predistorter A is provided, an increase in the processing load of the predistorter B is inhibited, thereby inhibiting an increase in the hardware scale.

Figure 5:
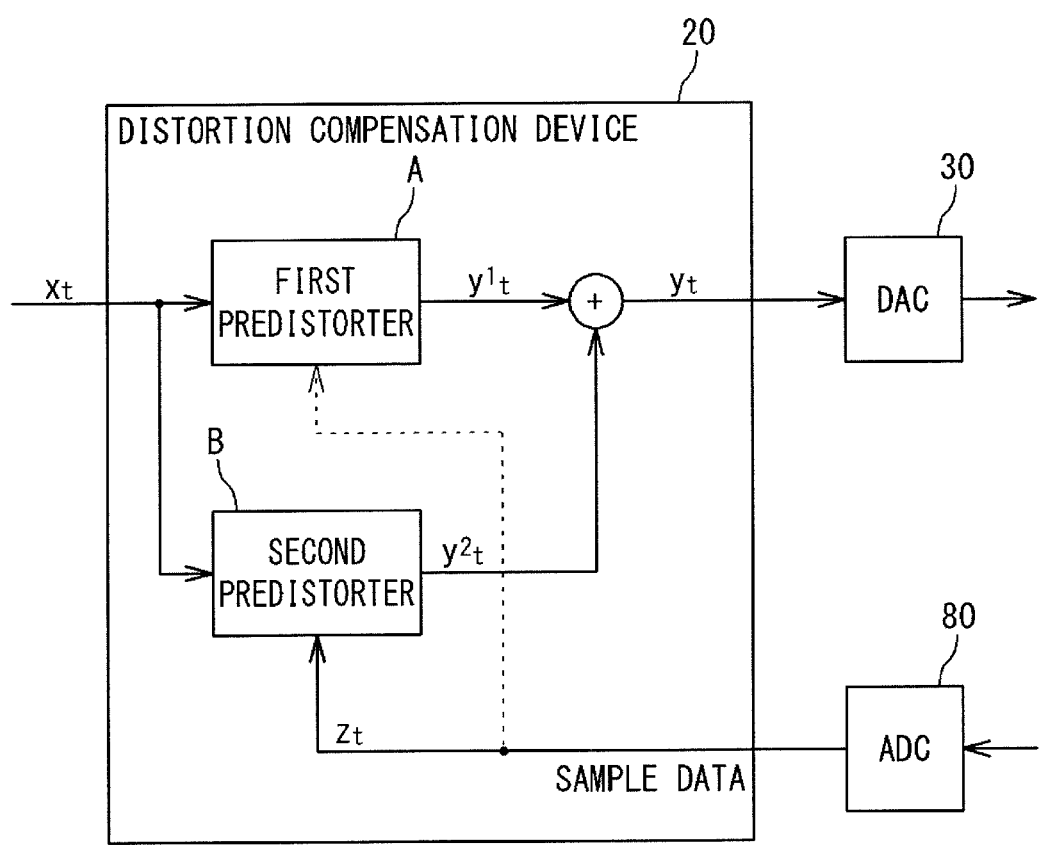
FIG. 5 is a block diagram showing a distortion compensation device.

FIG. 5 shows yet another example of the distortion compensation device 20. The distortion compensation device 20 shown in FIG. 5 includes a predistorter A and a predistorter B which are connected in parallel. In FIG. 5, a baseband signal $x_t$ is provided to the predistorter A and the predistorter B. The predistorter A compensates for a distortion during a normal operation other than when an instantaneous change in distortion occurs due to an Idq drift or the like. The predistorter A outputs a first distortion compensation signal $y^1_t$. The predistorter B deals with an instantaneous change in distortion due to an Idq drift or the like, and outputs a second distortion compensation signal $y^2_t$. The first distortion compensation signal $y^1_t$ and the second distortion compensation signal $y^2_t$ are added by an adder. The distortion compensation device 20 outputs a resultant distortion compensation signal $y_t$.

Also in the distortion compensation device 20 shown in FIG. 5, the predistorter A compensates for a distortion during a normal operation other than when an instantaneous change in distortion occurs due to an Idq drift or the like, and simultaneously, the predistorter B follows, in real time, an instantaneous change in distortion due to an Idq drift or the like to perform distortion compensation. Moreover, since the predistorter A is provided, an increase in processing load of the predistorter B is inhibited, thereby inhibiting an increase in hardware scale.

3. Additional Notes

Note that the embodiment disclosed herein is merely illustrative in all aspects and should not be recognized as being restrictive. The scope of the present invention is defined by the scope of the claims rather than by the meaning described above, and is intended to include meaning equivalent to the scope of the claims and all modifications within the scope.

REFERENCE SIGNS LIST

20 distortion compensation device
21A first predistorter
21B second predistorter
22A first predistorter
22B second predistorter
30 DAC
40 up-converter
50 power amplifier
60 antenna
70 down-converter
80 ADC
A first predistorter
B second predistorter

The invention claimed is:

1. A distortion compensation device comprising:
a first predistorter configured to compensate for a distortion in an amplifier; and
a second predistorter configured to compensate for the distortion in the amplifier, and update distortion compensation characteristics at a higher frequency than that of the first predistorter, wherein
the distortion includes a first nonlinear distortion of a predetermined order, and a second nonlinear distortion of an order lower than the first nonlinear distortion,
the first predistorter compensates for the first nonlinear distortion,
the second predistorter compensates for the second nonlinear distortion,
the first predistorter updates, at a predetermined frequency, a plurality of first distortion compensation coefficients, as the distortion compensation characteristics, which correspond to terms of a first polynomial for compensating for the first nonlinear distortion, and
the second predistorter updates a plurality of second distortion compensation coefficients, as the distortion compensation characteristics, which correspond to terms of a second polynomial for compensating for the second nonlinear distortion, at a frequency higher than that for the plurality of first distortion compensation coefficients.

2. The distortion compensation device according to claim 1, wherein the second predistorter compensates for a lower-order distortion as compared to the first predistorter.

3. The distortion compensation device according to claim 1, wherein the number of sample data to be used by the second predistorter for updating the distortion compensation characteristics is less than the number of sample data to be used by the first predistorter.

4. The distortion compensation device according to claim 1, wherein the first predistorter includes a processor configured to execute a computer program for updating the distortion compensation characteristics.

5. The distortion compensation device according to claim 1, wherein the first predistorter is an analog predistorter.

6. The distortion compensation device according to claim 1, wherein the second predistorter includes a wired logic circuit for compensating for the distortion.

7. The distortion compensation device according to claim 1, wherein the first predistorter and the second predistorter are cascade-connected to each other.

8. The distortion compensation device according to claim 7, wherein the second predistorter is connected to an input side of the first predistorter.

9. The distortion compensation device according to claim 1, wherein the first predistorter and the second predistorter are connected in parallel.

10. A distortion compensation method comprising:
compensating for a distortion in an amplifier by using a first predistorter and a second predistorter; and
updating distortion compensation characteristics of the second predistorter at a higher frequency than that of the first predistorter, wherein
the distortion includes a first nonlinear distortion of a predetermined order, and a second nonlinear distortion of an order lower than the first nonlinear distortion,
the first predistorter compensates for the first nonlinear distortion,
the second predistorter compensates for the second nonlinear distortion,
the first predistorter updates, at a predetermined frequency, a plurality of first distortion compensation coefficients, as the distortion compensation characteristics, which correspond to terms of a first polynomial for compensating for the first nonlinear distortion, and
in the updating distortion compensation characteristics of the second predistorter, a plurality of second distortion compensation coefficients, as the distortion compensation characteristics, which correspond to terms of a second polynomial for compensating for the second nonlinear distortion, is updated at a frequency higher than that for the plurality of first distortion compensation coefficients.

11. The distortion compensation device according to claim 1, wherein
a monitor signal, which is obtained by monitoring an output that is outputted from the amplifier and is compensated for by the first predistorter and the second predistorter, is provided to the first predistorter and the second predistorter, and
the first predistorter and the second predistorter update the corresponding distortion compensation coefficients on the basis of the monitor signal.

12. The distortion compensation device according to claim 1, wherein the number of sample data to be used by the second predistorter for updating the second distortion compensation coefficients is less than the number of sample data to be used by the first predistorter for updating the first distortion compensation coefficients.

* * * * *